United States Patent
Rixhon et al.

(10) Patent No.: US 11,196,291 B2
(45) Date of Patent: Dec. 7, 2021

(54) DATA CENTER WITH BACKUP POWER SYSTEM

(71) Applicant: CE+T Power Luxembourg SA, Troisvierges (LU)

(72) Inventors: Daniel Rixhon, Awans (BE); François Milstein, Liege (BE); Thierry Joannes, Flemalle (BE); Paul Bleus, Wandre (BE)

(73) Assignee: CE+T Power Luxembourg SA, Troisvierges (LU)

( * ) Notice: Subject to any disclaimer, the term of this patent is extended or adjusted under 35 U.S.C. 154(b) by 119 days.

(21) Appl. No.: 16/613,911

(22) PCT Filed: May 16, 2018

(86) PCT No.: PCT/EP2018/062694
§ 371 (c)(1),
(2) Date: Nov. 15, 2019

(87) PCT Pub. No.: WO2018/210917
PCT Pub. Date: Nov. 22, 2018

(65) Prior Publication Data
US 2021/0066957 A1    Mar. 4, 2021

Related U.S. Application Data

(60) Provisional application No. 62/508,150, filed on May 18, 2017.

(30) Foreign Application Priority Data

Oct. 3, 2017  (EP) .................................. 17194559

(51) Int. Cl.
*H02J 9/06*    (2006.01)
*G06F 1/26*    (2006.01)
(Continued)

(52) U.S. Cl.
CPC ............ *H02J 9/062* (2013.01); *G05B 19/042* (2013.01); *G06F 1/263* (2013.01); *G06F 1/28* (2013.01);
(Continued)

(58) Field of Classification Search
CPC .... H02J 3/381; H02J 2300/10; H02J 2300/20; H02J 2300/24; H02J 3/38; H02J 7/34;
(Continued)

(56) References Cited

U.S. PATENT DOCUMENTS 8,044,535 B2    10/2011  Bleus
8,219,839 B2 *   7/2012  Akimoto ................. G06F 1/305
                                                                 713/320
(Continued)

FOREIGN PATENT DOCUMENTS

WO    WO 2015/157999 A1    10/2015

OTHER PUBLICATIONS

ABB; Modular UPS Systems, Uninterruptible Power Supply Systems, The Modular Approach; undated document (see reference at paragraph [0015] of background); 9 pages; www.abb.com/ups.

*Primary Examiner* — Chun Cao
(74) *Attorney, Agent, or Firm* — Reinhart Boerner Van Deuren P.C.

(57) ABSTRACT

The present invention is related to a hardware developed for allowing the virtualization of power and therefore bringing change to the data center market. This new concept, unique in the industry, offers the missing link to respond to the multiple and contradictory challenges the industry will be facing in managing power. The concept of a rack mounted power pack sized for average loads, is allowing peak shaving, and microgrid utilization. The combination of renewable power sources and grid connections enables cost savings while increasing the resilience of the overall (Continued)

infrastructure. The so-called "Power Fusion" operates like a decentralized double conversion UPS with all the advantages of centralized architecture.

17 Claims, 9 Drawing Sheets

(51) Int. Cl.
| | |
|---|---|
| *G05B 19/042* | (2006.01) |
| *G06F 1/28* | (2006.01) |
| *H02J 3/38* | (2006.01) |
| *H04Q 1/28* | (2006.01) |
| *H05K 7/14* | (2006.01) |

(52) U.S. Cl.
CPC .............. *H02J 3/381* (2013.01); *H04Q 1/28* (2013.01); *H05K 7/1492* (2013.01); *G05B 2219/2639* (2013.01); *H02J 2300/10* (2020.01); *H02J 2300/24* (2020.01)

(58) Field of Classification Search
CPC ... H02J 9/062; H02J 3/382; H02J 3/46; G05B 19/042; G05B 2219/2639; G06F 1/263; G06F 1/28; H04Q 1/28; H05K 7/1492; Y02B 10/70

USPC ........................................................ 700/295
See application file for complete search history.

(56) References Cited

U.S. PATENT DOCUMENTS

| | | | |
|---|---|---|---|
| 2007/0217178 A1 | 9/2007 | Johnson, Jr. et al. | |
| 2008/0030078 A1 | 2/2008 | Whitted et al. | |
| 2008/0129120 A1 | 6/2008 | Su et al. | |
| 2010/0211807 A1* | 8/2010 | Akimoto ................... | G06F 1/26 713/310 |
| 2011/0018342 A1 | 1/2011 | Park et al. | |
| 2011/0245988 A1* | 10/2011 | Ingels ....................... | H02J 3/14 700/295 |
| 2012/0086269 A1 | 4/2012 | Nakano et al. | |
| 2012/0303993 A1* | 11/2012 | Nishtala .................... | G06F 1/28 713/340 |
| 2014/0379160 A1* | 12/2014 | Fallon ...................... | G06Q 50/06 700/297 |
| 2015/0036266 A1* | 2/2015 | Emert ...................... | H05K 7/026 361/624 |
| 2015/0061384 A1 | 3/2015 | Towner et al. | |
| 2015/0157999 A1 | 6/2015 | Tammera | |
| 2016/0006247 A1 | 1/2016 | Fang | |
| 2016/0006299 A1* | 1/2016 | Myhre ................... | H02J 7/0068 307/66 |
| 2017/0207654 A1* | 7/2017 | Navarro ................. | H02J 9/062 |

* cited by examiner

DATA CENTER WITH BACKUP POWER SYSTEM

FIELD OF THE INVENTION

The present invention is related to a new power backup technology targeting data centers, telecom environments and equivalent infrastructures, and being a mix of ECI™ UPS technology, also known and patented as TSI™, of microgrids and of power virtualization.

BACKGROUND

Modern data center infrastructures, excluding the ICT equipment they host, can cost hundreds of millions of dollars to construct. Most of this cost is attributed to the electrical and mechanical systems, which distribute power and cooling to servers, storage, and network devices. Among the parameters that define the capacity of the data center, power is usually the first to be exhausted because of the load limitation on the power grid and the increasing power density of computing.

Power gets stranded in almost every data center. Data-center managers are challenged with having the appropriate power available at deployed servers at the right time. It is common to have allocated server power that is over provisioned resulting in stranded power capacity. Reclaiming stranded power enables an organization to extend the life of its data center, thereby avoiding the CAPEX and the time required for a major upgrade or the construction of a new facility.

Telecom networks and data centers now intend to become software-centric. The transformation is already underway implementing virtual functions to run on commodity hardware. Moreover, future power backup systems must be smart enough to cope with the workload constantly changing and moving within the infrastructure. Virtualizing ICT tasks makes the reliability of power equipment even more stringent whereas the power sources are not necessarily stable and available at all time.

Microgrid demonstrations and deployments have shown the ability of microgrids to provide higher reliability and higher power quality than utility power systems and improved energy utilization. Smart grids also enable a more efficient use of electricity, shaving losses incurred during delivery and encouraging more efficient energy behaviour by customers.

Combining microgrid infrastructures with the latest developments in energy conversion allows to face the sustainability challenges of the data centers along with the availability of power and the infrastructure flexibility that are required to run reliable and profitable business.

The applicant of the present application designs, manufactures and markets a range of products for industrial operators with mission critical applications, who are not satisfied with existing AC backup systems performances, and related maintenance costs.

In particular, the applicant already markets the so-called ECI™ module (for Enhanced Conversion Innovation) that is an energy router that offers an innovative AC backup solution that is unlike other UPS's.

To better allocate power resources and make use of stranded power, the applicant has developed this energy router that provides data center managers a tool for directing power to the appropriate servers as demand increases. The above energy router actually allows the skilled person to build a power structure using multiple AC and DC power sources. The modular design of this energy router allows data center operators to give the ability to utilize a multi-source, multi-directional device to allocate power wherever it is needed or it makes most sense, and in particular by:
  maximizing the operator's applications uptime;
  operating with lowest OPEX;
  providing best protection toward disturbances;
  optimizing footprint.

As shown in FIG. 1, each ECI module 1 has an AC bi-directional input 2 and a DC bi-directional input 3 and provides a pure sine wave output 4 that is also bi-directional.

ECI™ is a UPS modular technology with:
  no single point of failure;
  high MTBF;
  true redundancy;
  best in-class protection to disturbances; and
  no maintenance (or maintenance-free technology).

The ECI™ is patented under U.S. Pat. No. 8,044,535 B2.

PRIOR ART

Document US 2015/061384 A1 discloses that, in a data center having multiple resource zones, each of the zones has an uninterruptible power supply (UPS) and associated power storage elements such as batteries. A power bus may be provided between the resource zones to connect the outputs of the power storage elements of the resource zones. The power storage elements may thereby be shared between the UPS's so that an individual resource zone may be operated for a longer duration under anomalous conditions.

Document US 2008/030078 A1 discloses an apparatus and associated method and computer program products that involve a highly efficient uninterruptible power distribution architecture to support modular processing units. As an illustrative example, a modular processing unit includes a corresponding uninterruptible power system in which only one AC-to-DC rectification occurs between the utility AC grid and the processing circuit (e.g., microprocessor) loads. In an illustrative data center facility, a power distribution architecture includes a modular array of rack-mountable processing units, each of which has processing circuitry to handle network-related processing tasks. Associated with each modular processing unit is an uninterruptible power supply (UPS) to supply operating power to the network processing circuitry. Each UPS includes a battery selectively connectable across a DC bus, and a AC-to-DC rectifier that converts an AC input voltage to a single output voltage on the DC bus. The regulated DC bus voltage may be close to the battery's fully charged voltage.

In US 2011/018342 A1, the need for an uninterrupted power supply (UPS) in a data center is obviated by tying a DC voltage from a backup power source directly to the motherboards of multiple servers in the data center. AC power received from a power utility service is converted into a lower voltage by a site transformer and then provided to one or more power distribution units at a site. The power distribution units supply power to a plurality of servers, which include power supplies that convert the AC electrical power to DC electrical power for use by the servers' motherboards. In the event of a failure of power from the utility service, the backup power source provides DC electrical power to the motherboards, e.g., for sufficient time to start up a generator to provide power in place of the utility service.

Document Uninterruptible power supply systems: The modular approach, © Copyright 2013 ABB, discloses modular UPS, distributed power protection with string of servers with dual power supply (one UPS system per string) and centralized power protection (as well as dual power supply).

Document US 2007/0217178 A1 discloses a modular uninterruptible power supply (UPS) system including a plurality of UPS system component modules, each configured to be arranged in at least one equipment rack, each of the UPS system component modules having at least one flexible power cable extending therefrom and having a pluggable first connector at an end thereof. The system also includes a modular power interconnect assembly configured to be attached to at least one equipment rack, the modular power interconnect assembly including a housing, a plurality of bus bars positioned within the housing, and a plurality of second connectors positioned at a face of the housing, electrically connected to the plurality of bus bars and configured to pluggably mate with the first connectors to provide electrical interconnection among the plurality of UPS system component modules.

Document US 2008/129120 A1 discloses a device for controlling a single-phase power conditioner for a renewable energy system. The device comprises: a power system, providing alternating current (AC) utility power; a renewable energy system, using a natural resource so as to generate direct current (DC) power; a DC-to-DC converter, accepting the DC power generated by the renewable energy system so as to convert an input DC voltage of the DC power to an output DC voltage at a voltage level different from the DC input voltage; a grid-tied power conditioner, transforming voltage levels of the AC power and DC power; a controller, issuing a control signal for controlling the grid-tied power conditioner; and a load, consuming electricity by way of the grid-tied power conditioner.

Document US 2016/006247 A1 discloses a power supply method, including: rectifying a second alternating current, and converting the second alternating current into a second high voltage direct current; when the second high voltage direct current is abnormal, inputting a third high voltage direct current to a DC/DC module; when the second high voltage direct current is normal, inputting the second high voltage direct current to the DC/DC module; and converting, by the DC/DC module, the second high voltage direct current or the third high voltage direct current into a low voltage direct current for outputting.

Aims of the Invention

The present invention aims to provide a reliable solution to infrastructure failures mainly related to the risk of power blackout.

In particular, the invention aims at combining efficient UPS technology, microgrids and power virtualization under the form of a so-called "Power Fusion" concept.

Still more particularly the invention aims at making infrastructure truly resilient, while saving money. Combination of commercial power sources and microgrids could make the power delivery system less vulnerable for example to terrorism attacks and natural disasters, restore power faster after a disruption, and make critical services less vulnerable while the delivery of conventional electric power has been disrupted. Cogeneration is also typically an efficient way to generate electricity and heat, to save money and reduce the carbon footprint. Implementing a microgrid requires funding as well as power engineering. It is not a simple matter of just buying a new suitcase generator and circuit breaker.

SUMMARY OF THE INVENTION

The present invention relates to a data center, a telecom environment or an equivalent infrastructure, comprising:

a first external AC power bus powered by a first AC grid and a second external AC power bus powered by a second AC grid;

a plurality of string-linked server units providing computing resources, each server unit having a first AC input connection to the first external AC power bus and a second AC input connection to the second external AC power bus, said first external AC power bus and said second external AC power bus connecting each in series all the server units linked in the string, at least one uninterruptible power supply unit, in short UPS unit, acting as a power backup satellite connected to the first external AC power bus and at least one UPS unit acting as a power backup satellite connected to the second external AC power bus, each of the power backup satellites being capable to provide operating power to the computing resources of each of the server units linked in the string, a dedicated internal or inter-satellites power bus not directly powered by the first and second AC grids, for powering the said power backup satellites, so that the value of DC power supplied to said power backup satellites can vary from a satellite to another one, and smart control means, wherein the smart control means are capable to identify the occurrence of a local power peak demand at a particular server unit and to command at least one power backup satellite having power reserve to share at least part of its power reserve with this local server unit via the internal power bus, while keeping the voltage on the internal power bus stable and/or in an acceptable range.

In the context of the invention, the data center comprises a number of string-linked ICT servers that are individually provided with power backup satellites (racks). The servers are powered by external AC sources via "external" AC (redundant) buses. The dedicated "internal" or inter-satellites power bus according to the invention is not directly powered by the external AC sources, but is internal in the data center system.

The part of power reserve of a satellite available for sharing is the DC power stored in the battery (of the UPS) but it can also be seen as the difference (margin) between the nominal output power of the satellite and the actual output power delivered by the satellite.

According to preferred embodiments, the data center, telecom environment or equivalent infrastructure additionally comprises one of the following characteristics or a suitable combination thereof:

the internal power bus is a DC power bus or an AC power bus;

the internal DC power bus is connected to one or more renewable energy sources or to a DC energy storage unit;

the DC energy storage unit comprises one or more batteries;

the internal DC power bus is a 380V or a 600V HVDC power bus, and/or the DC power supplied to or stored in the power backup satellite is a 48V DC power, possibly through an intermediate DC/DC converter;

the power backup satellite is a bidirectional UPS unit, having an AC input, an AC output and a DC input, said DC input being connectable to a DC power bus or to a DC energy source or storage unit for providing temporary power to the UPS unit;

a DC storage unit is provided locally at each satellite, with a nominal DC voltage which can be different from one power cell to another one;

a first and second central auxiliary power unit are connected to the first external AC power bus, to the second external AC power bus respectively, being capable to replace when necessary the first AC grid, the second AC grid respectively, thanks to an automatic transfer switch;

the AC output and the AC input of a first centralized UPS unit are connected at the first external AC power bus to each server unit in a string and to the first AC grid or to a first central auxiliary power unit respectively, the DC input of the first centralized UPS unit being connected to the internal DC power bus, and the AC output and the AC input of a second centralized UPS unit are connected at the second external AC power bus to each server unit in the string and to the second AC grid or to a second central auxiliary power unit respectively, the DC input of the second centralized UPS unit being connected to the internal DC power bus;

each string-linked server unit is associated with a first local UPS unit whose AC terminals are connected at the first external AC power bus between the first AC input of said server unit and the first AC grid or a first central auxiliary power unit, and with a second local UPS unit whose AC terminals are connected at the second external AC power bus between the second AC input of said server unit and the second AC grid or a second auxiliary power unit, the DC input of the first and the second UPS units being each connected to an inter-satellites DC power bus;

it additionally comprises a local bidirectional battery-supplied DC/DC converter module associated with said string-linked server unit via the inter-satellites DC power bus, so as to allow local energy storage for power peak shaving;

the AC output and the AC input of a first centralized UPS unit are connected at the first external AC power bus to each server unit in a string and to the first AC grid or to a first central auxiliary power unit respectively, the DC input of the first centralized UPS unit being connected to the internal DC power bus, and the AC output and the AC input of a second centralized UPS unit are connected at the second external AC power bus to each server unit in the string and to the AC second grid or to a second central auxiliary power unit respectively, the DC input of the second centralized UPS unit being connected to the internal DC power bus, and the AC input and the AC output of a local UPS unit are connected in parallel on the first external AC power bus at the first AC input and on the second external AC power bus at the second AC input of each server unit respectively, the DC input of the local UPS unit being connected to a DC energy storage unit such as a L-ion battery, so as to achieve a power peak shaving;

the local UPS unit is commanded by the smart control means so as to achieve power balance between the first external AC power bus and the second external AC power bus;

the server units are distributed over two strings;

the peak power sustained by each server unit is times the nominal power;

the first and the second AC grids are n-phase AC sources, with n=1, 2 or 3;

the first and the second external AC power buses are n-phase AC power buses, with n=1, 2 or 3.

DETAILED DESCRIPTION OF THE INVENTION

Overbooking the power infrastructure for a high percentile of the needs is becoming more attractive than for occasional peaks. Using decentralized batteries to temporarily supply the load for suppressing peaks allows aggressive under-provisioning of the power distribution in the data center. It also unleashes stranded power in brownfield applications.

At the same time, connecting decentralized power packs through a HVDC bus offers a mechanism to prevent local shortages by mutualizing storage resources, having different nominal voltages, autonomy, technology or even aging state.

Figure 3:
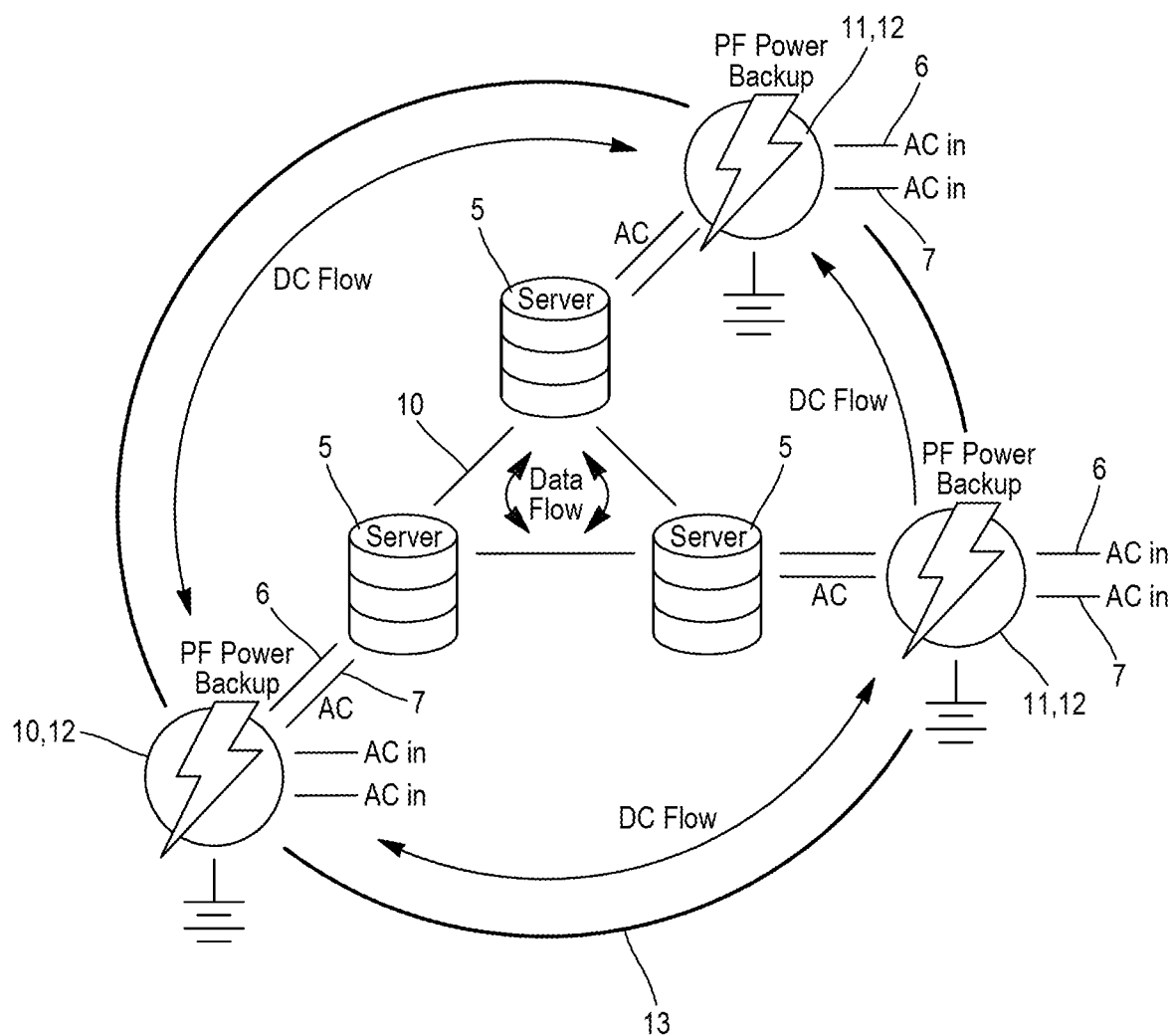
FIG. 3 is schematically representing the conceptual view of a Power Fusion (PF) according to the present invention.

The concept of Power Fusion (PF) is schematically shown on FIG. 3. Today the data centers comprise ICT servers 5 that are often provided with individual power backup racks or "Satellites" 11, 12. The idea of the invention is to power all these individual backup racks with and in a DC (or AC) power grid 13 (e.g. DC power flow in 380V or 600V DC bus). In this configuration, the satellites may be advantageously disposed remotely from each other, e.g. up to a 100 meter distance.

According to the invention principle, each server 5 not working at full power will have an unused or stranded power capacity and will make this unused power capacity available to the other servers connected 5, e.g. through a 380V DC bus. As mentioned above, generally power capacity is over-dimensioned and such a reserve power capacity always exists in any existing power system. Smart control devices (not shown) will then allow the satellites 11, 12 to communicate with each other and allocate reserve power to those which need it. The novelty is to provide a technology which identifies a local power peak demand of a particular server and shares with this local server the reserve power stored in one or more other server-linked power cells in the power grid.

Microgrid deployments have shown their ability to provide higher reliability and higher power quality than utility power systems and improved energy utilization. The microgrid concept exploits redundancy and diversity in energy sources to offer such robustness and resilience that reduce the dependability to battery storage. Some studies (University of Texas in Austin) have shown that with a grid availability at three nines, up to four hours' battery backup should be required to obtain five nines availability in mission critical infrastructures leaning on generators only for their backup.

Figure 4:
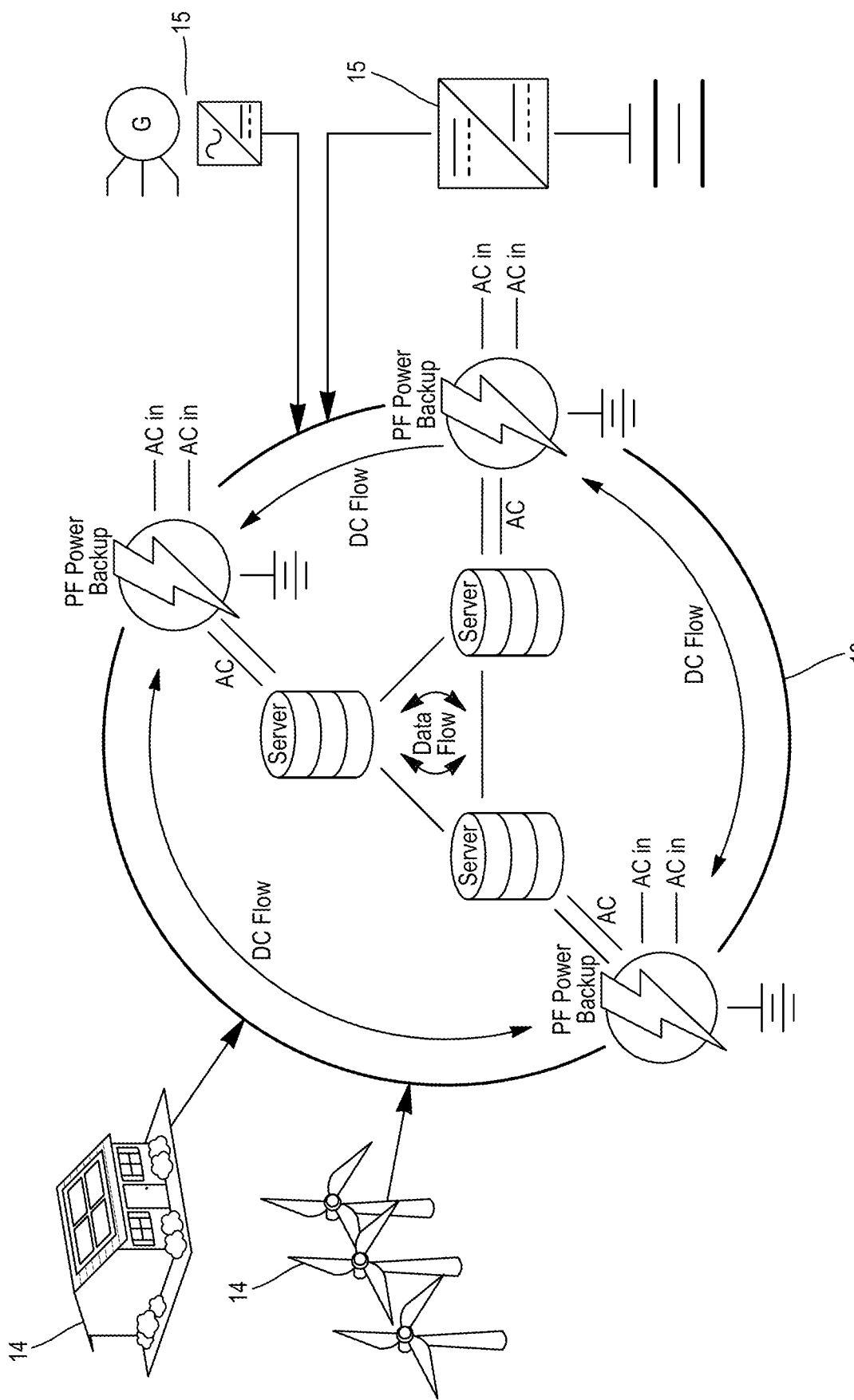
FIG. 4 is schematically representing the use of a HVDC ring in a PF with alternate power sources.

A variety of energy sources interconnected on a HVDC bus (DC renewable sources, DC energy storage sources), as shown on FIG. 4, brings three interesting benefits.

Firstly, it reduces the dependency on battery storage and allows to reduce drastically the autonomy to what is strictly necessarily to filter ATS transients and start the generator set.

Secondly, it rids the data center of all the switchgear equipment used for synchronizing generators.

Thirdly, it provides multiple routes to convey the power from the inlet of a building to the load. The dynamic assignment of the route can either compensate the failure of distribution components, remove power congestions or optimize the power transfer.

The use of an internal or inter-satellites DC bus to interconnect the DC sources and share power has also a number of advantages. Firstly, the local power availability rate is better than with an AC bus connected to an external AC source.

An AC bus may be temporarily unavailable owing to grid breakdown, which cannot allow to warranty a permanent delivery of a nominal AC voltage. Secondly, the amount of power transferred is approximately increased by a factor 2 for a DC bus that works at permanent DC voltage at least equal (but generally 380V) to the AC bus peak voltage (e.g. 230V), at equal copper cross-section and equal losses ($RI^2$), at a current divided by $\sqrt{2}$ and equal isolation material dielectric voltage. It is also more convenient to use a DC bus for connecting batteries of different voltages or other energy storage means through bidirectional converters. Thus using a DC bus instead of an AC bus provides simplification, and increases availability, efficiency, flexibility and also makes simpler energy management as it is based on DC measurements.

The dedicated internal DC power bus can also be replaced by a dedicated internal AC power bus. The "dedicated" AC power bus, contrary to the first and second "external" AC power buses, is not connected to the mains supply or to a diesel generator set. The bidirectional property of this dedicated AC bus should be properly accounted for since one cannot reinject power into a generator set. One advantage of using a dedicated internal AC bus is the opportunity to connect voltage transformers (e.g. from 50 Hz up to several hundreds of Hz, at 230V or higher) and to easily implement a protection because AC breakers are cheaper and have faster opening time in case of short-circuit.

Description of Preferred Embodiments of the Invention

Figure 1:
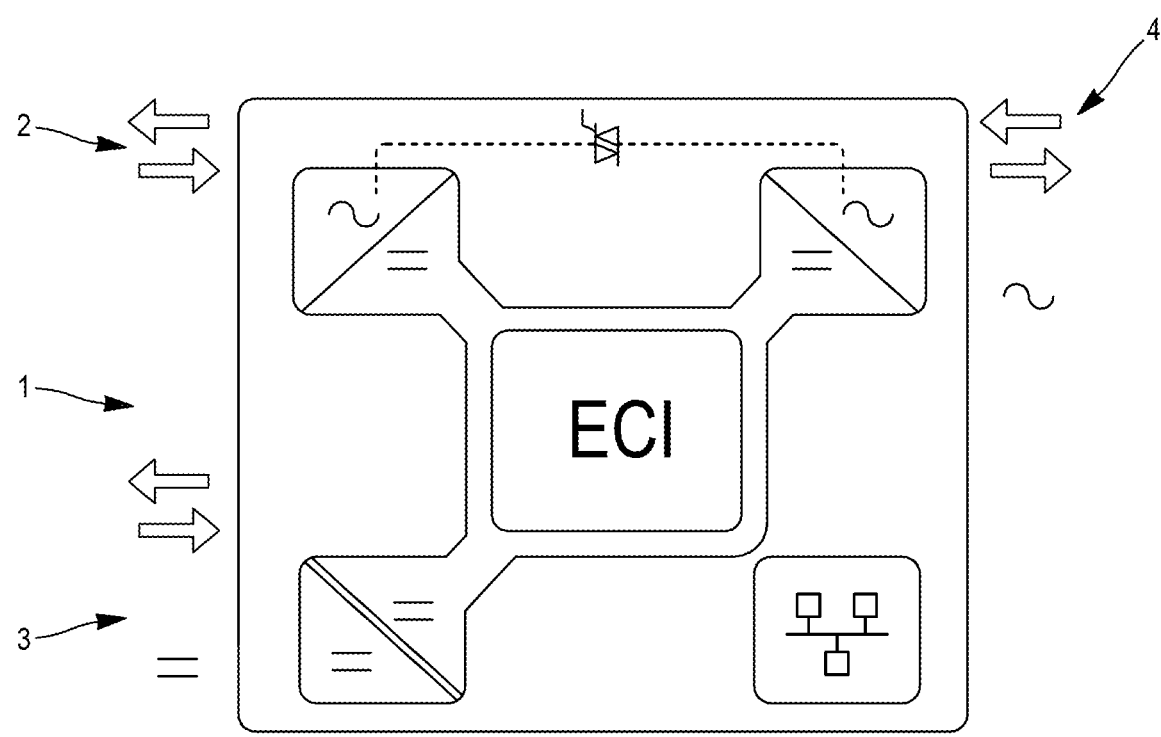
FIG. 1 is schematically representing a building block for the data center power supply according to the present invention, under the form of a ECI™ multidirectional energy router module.
Figure 2:
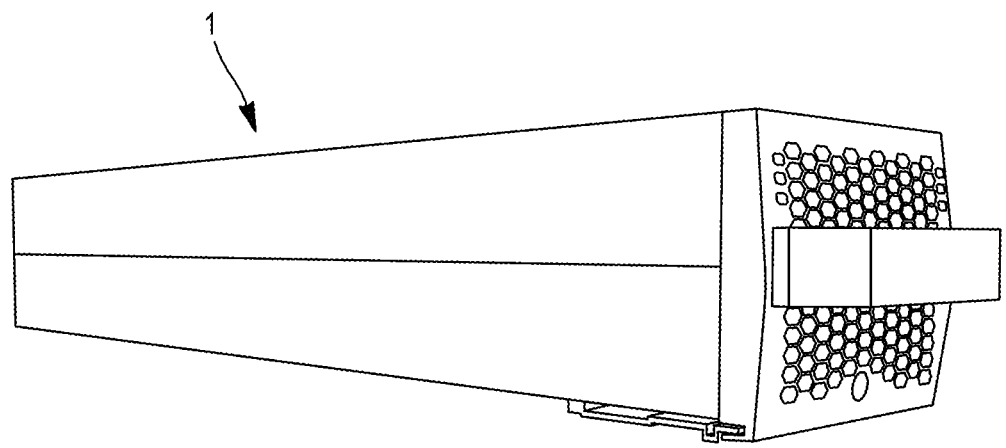
FIG. 2 is physically representing a ECI™ module.
Figure 5:
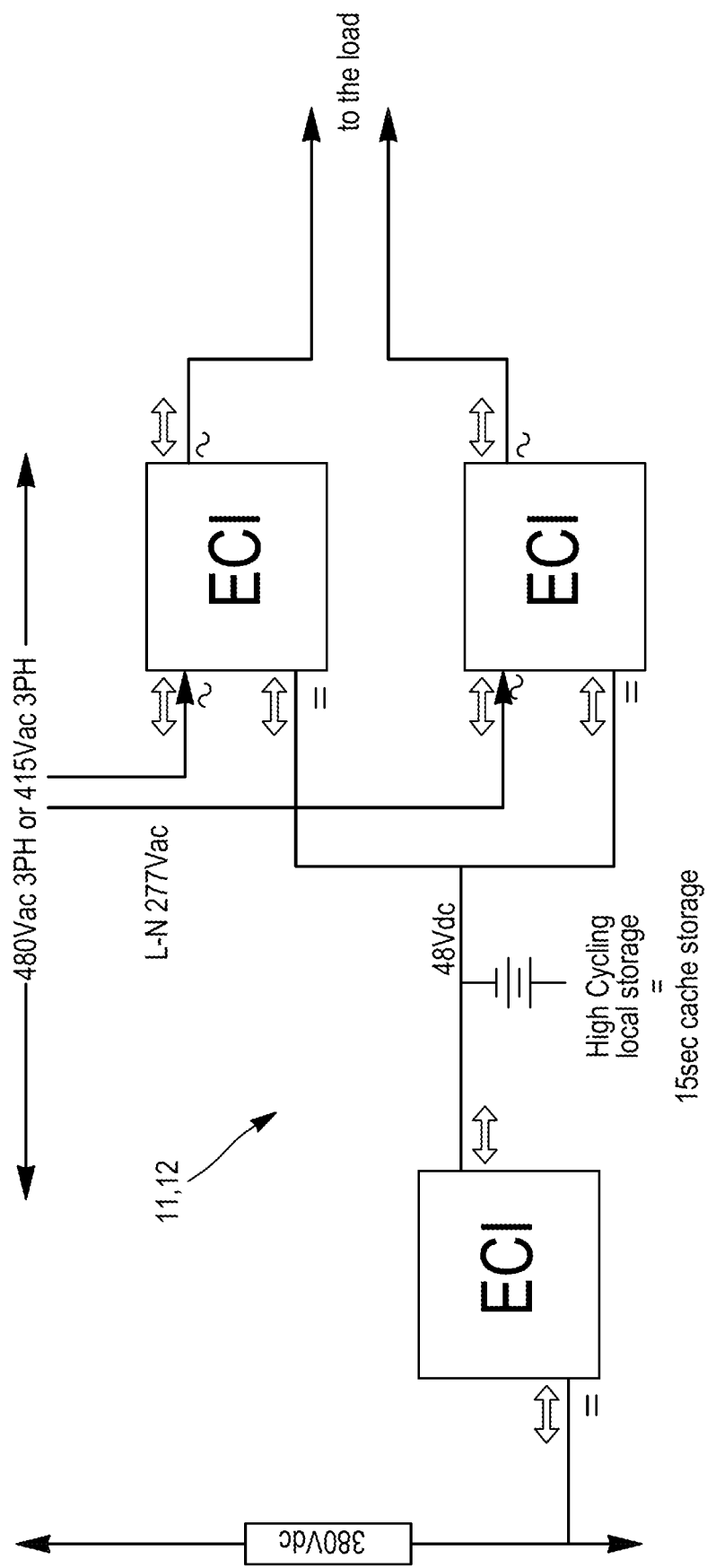
FIG. 5 is schematically representing a Power Fusion Satellite (PFS).
Figure 6:
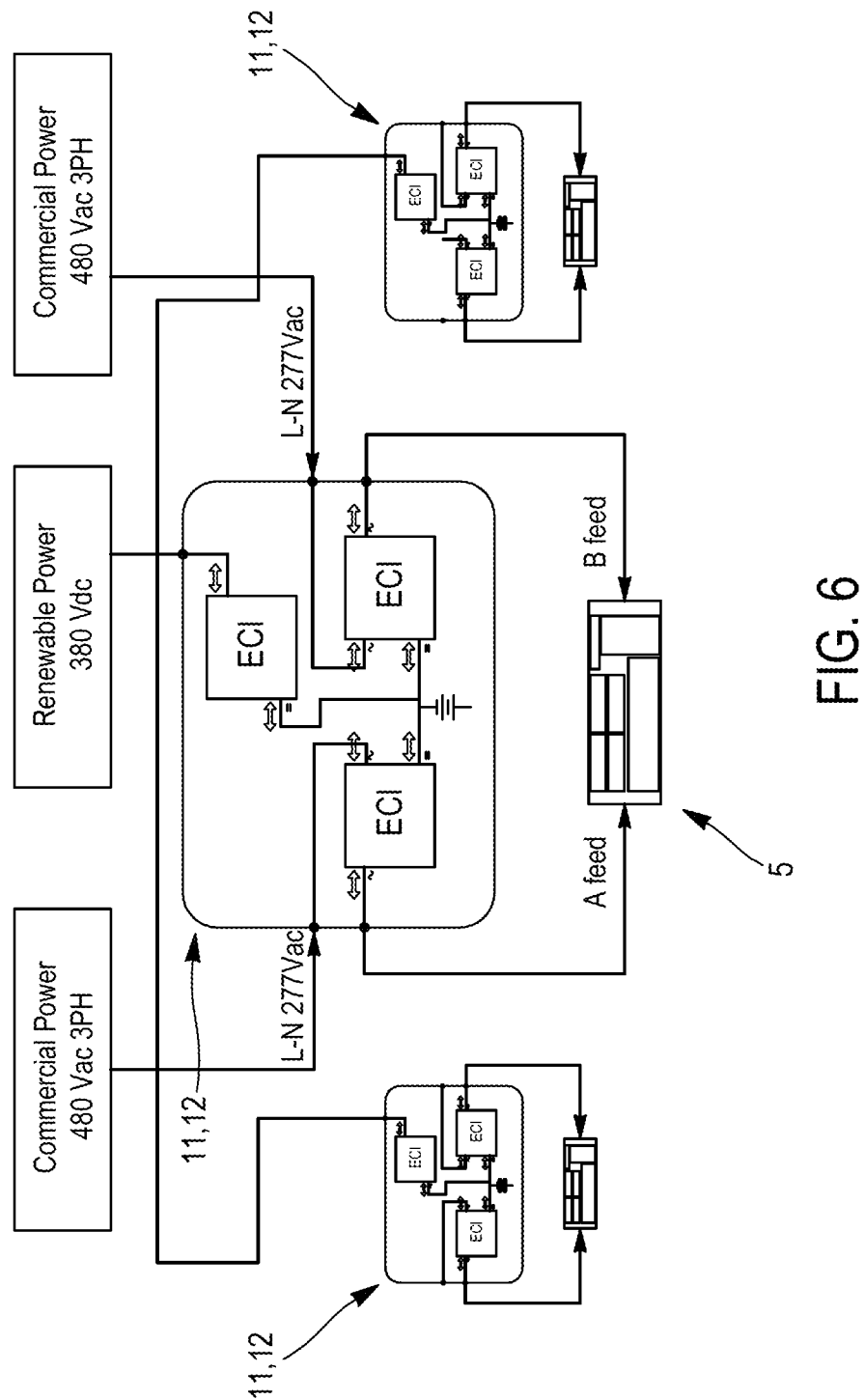
FIG. 6 is schematically representing the mesh structure of the PF concept.

The PF practical and physical implementation described below according to preferred embodiments of the invention is based upon the UPS technology patented and marketed by the applicant, called "Enhanced Conversion Innovation" (ECI™), as depicted on FIG. 1, that combines several stages of conversion in a single relatively small module, as physically depicted in FIG. 2. Several modules thereof can be advantageously bundled to build a "PF Satellite", as shown on FIG. 5, whereas a plurality of PF Satellites, as shown on FIG. 6, are advantageously interconnected through DC busways to operate as a microgrid, as shown on FIG. 7. A PF Satellite is featured with local storage with cycling capability. It can be either a power receiver, or a conditioner, or a generator according to load requirements (see FIG. 5).

The PF Satellites are thus organized in a mesh network which optimizes energy sourcing, distribution and availability. As shown on FIG. 6, each server rack 5 advantageously has two entries A and B, each connected to a PF Satellite 11, 12 built-up with ECI™ devices, for creating the bidirectional link from the server 5 to the AC/DC grid and vice versa.

A combination of renewable power sources and grid connections, as shown on FIG. 4, enables cost savings while increasing the resilience of the overall infrastructure. Peak shaving can also be implemented thanks to local storage in the PF Satellite. Moreover, in case of high and persistent power demand on one given load, other PF Satellites can support transferring energy through the DC busway. A unique feature over prior art, the "Power Fusion", or PF, operates like decentralized double conversion UPS with all the advantages of centralized architecture. Level of redundancy is also quite flexible from basic to tier-4 making the concept suitable for a large variety of applications with Net Zero Consumption mindset.

Advantageously, according to an embodiment of the invention, the internal power bus interconnecting the satellites may be an internal AC power bus.

In summary, the advantages of the PF concept are the following:
  reducing the stranded power in the data center;
  selecting the most economical source of energy at a time;
  providing storage DC voltages which can be different from one Satellite to another one (e.g. 380V, 48V, etc.);
  switching to available source of energy;
  peak shaving, compensating imbalances;
  slashing switchgears, UPS, STS, Genset Controls;
  virtualizing the power, with multi-redundant topology;
  ensuring full flexibility in growth, remodelling and backup resource management, with almost infinite expandability; and
  building step by step as the user grows, infrastructure costs being pushed to rows.

The present invention further allows to build a data center with a single converter module. The ECI™ as a building block is a versatile converter/router of energy. Based upon true redundancy as a concept it is also hot swappable and maintenance free. It can be used as corner stone for addressing all functions in a data center and notably to be the link between various types of sources and loads.

Figure 7:
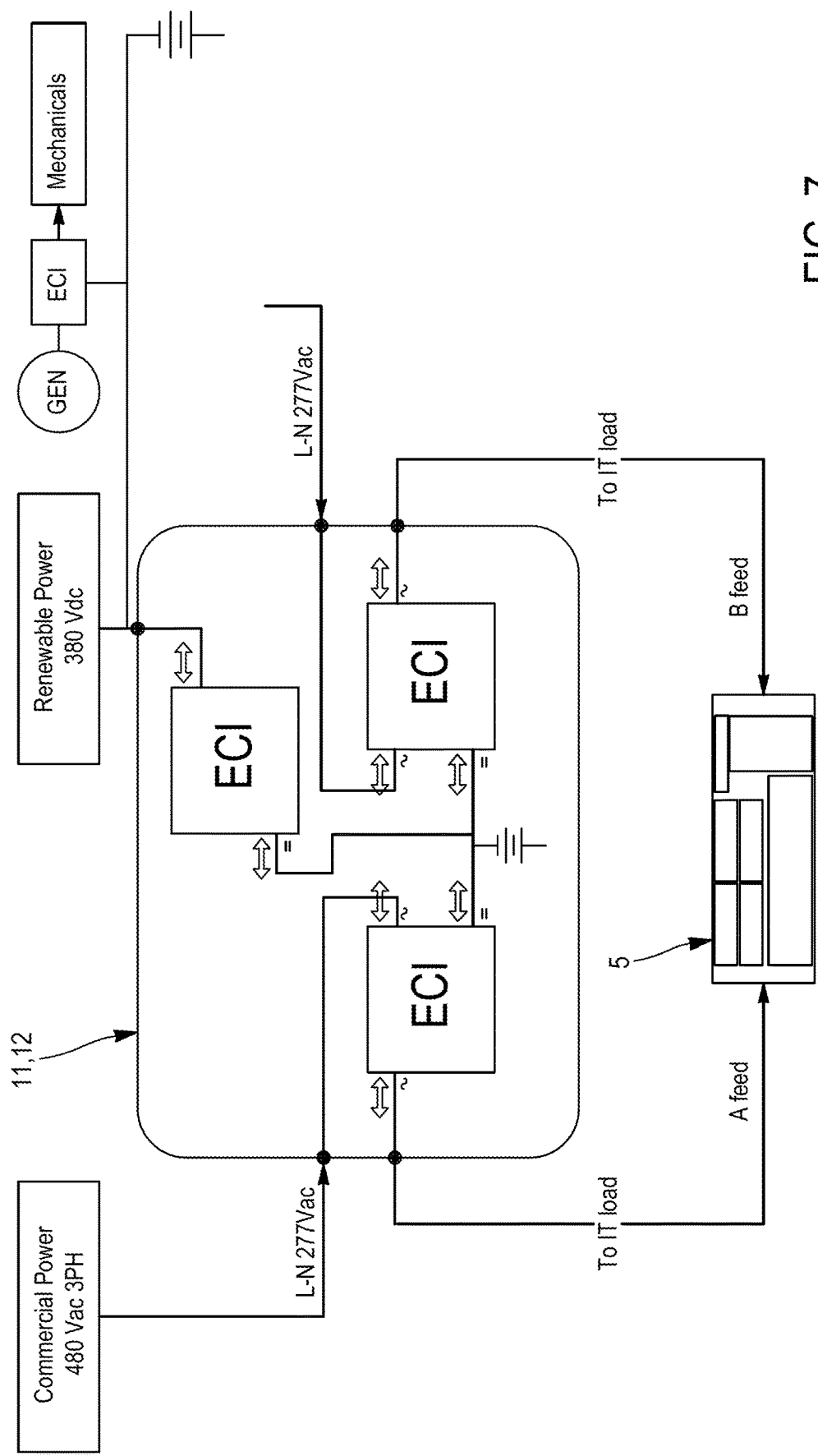
FIG. 7 is schematically representing the data center infrastructure based upon the above-mentioned single module.

FIG. 7 shows how beside the PF, the ECI™ can be used to connect generators, fuel cells, and renewable energy sources to HVDC bus. It is also used to provide a mass storage of energy to the same HVDC bus. Moreover, can also be used as a router to connect genset to mechanicals. Each ECI™ can be used as a switch and as a tap to control the direction and the magnitude of energy exchange. Putting a supervision system on top of the infrastructure brings full control of energy flows to facility manager.

As an important consequence of the invention is the ability to use one single piece of hot swappable hardware to perform various functions that are today accomplished by multiple products, brands and monolithic equipment. The perspective about maintenance costs and logistic savings is expected to be quite huge.

Examples of Architectures

In order to design the architecture embodiments according to the present invention, the following constraints have been retained:

a series of server cabinets distributed in two strings (right and left on the figures);

number of server cabinets to power: 2n (n server cabinets in each string);

optional transfer of work tasks from one server to another one in a string and even from one string to another one (estimated transfer time: ca. 15 sec);

two power entries in each server cabinet: AC inputs A & B;

$P_{mean}$ of each server cabinet=P;

$P_{peak}$ of each server cabinet=2P;

2 AC grids available: Main A and Main B;

2 available auxiliary power units on the AC grids (GEN A and GEN B);

switch between AC grids and auxiliary power units by ATS (ATS A and ATS B);

one 380 V DC supply grid to which are connected renewable energy sources (windmills, photovoltaic panels, etc.) and possibly a 380V DC energy storage unit;

use of UPS patented technology ECI™ with 3 bidirectional ports ($AC_{in}$, $AC_{out}$ and $DC_{in}$).

The aims thereof are the following:

propose a data center architecture of TIER 3 or 4 (very high guaranteed availability, at least >99.98%);

reduce CAPEX/OPEX of a data center installation.

Figure 8:
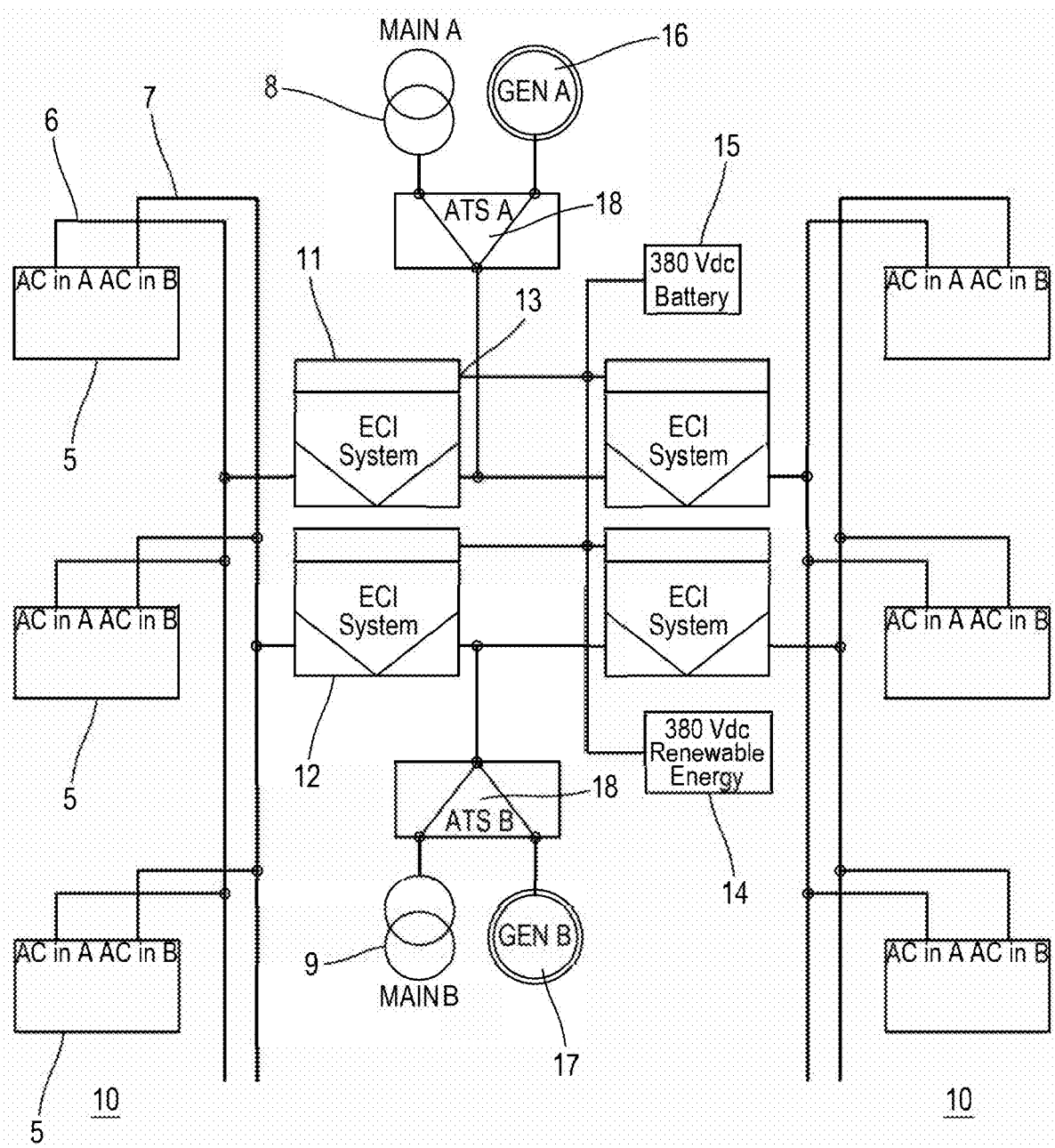
FIG. 8 is schematically representing an embodiment of the present invention corresponding to a centralized data center (data center "C").

According to one embodiment shown on FIG. 8, a first architecture is proposed: data center "C" (for "centralized").

Each string of n server cabinets includes two centralized UPS of ECI type (A and B strings), modular/redundant, connected to centralized battery and to renewable energy 380V DC port (see FIG. 8). The nominal ECI UPS power is 8nP for 4nP server peak power. There is no load shaving.

More particularly, as depicted on FIG. 8, the AC output and the AC input of a first centralized UPS unit 11 are connected at the first external AC power bus 6 to each server unit 5 in a string 10 and to the first AC grid 8 or to the first central auxiliary power unit 16 respectively through first ATS 18, the DC input of the first centralized UPS unit 11 being connected to the internal DC power bus 13 and wherein the AC output and the AC input of a second centralized UPS unit 12 are connected at the second external AC power bus 7 to the each server unit 5 in the string 10 and to the second AC grid 9 or to the second central auxiliary power unit 17 respectively through second ATS 18, the DC input of the second centralized UPS unit 12 being connected to the internal DC power bus 13.

According to one embodiment, a second architecture is proposed: data center "D" (for "decentralized").

Each server cabinet has local UPS (A+B AC input/output) having local storage unit allowing "power peak shaving" on both AC entries A and B. The server cabinet contains (see FIG. 9):

two local UPS (A+B AC input/output) of ECI type (modular/redundant) connected to a renewable grid 380V DC port;

one bidirectional DC/DC module with Li-ion battery allowing local storage for "power peak shaving".

The nominal ECI UPS power is 8nP, with 2nP DC/DC for 4nP server peak power.

Figure 9:
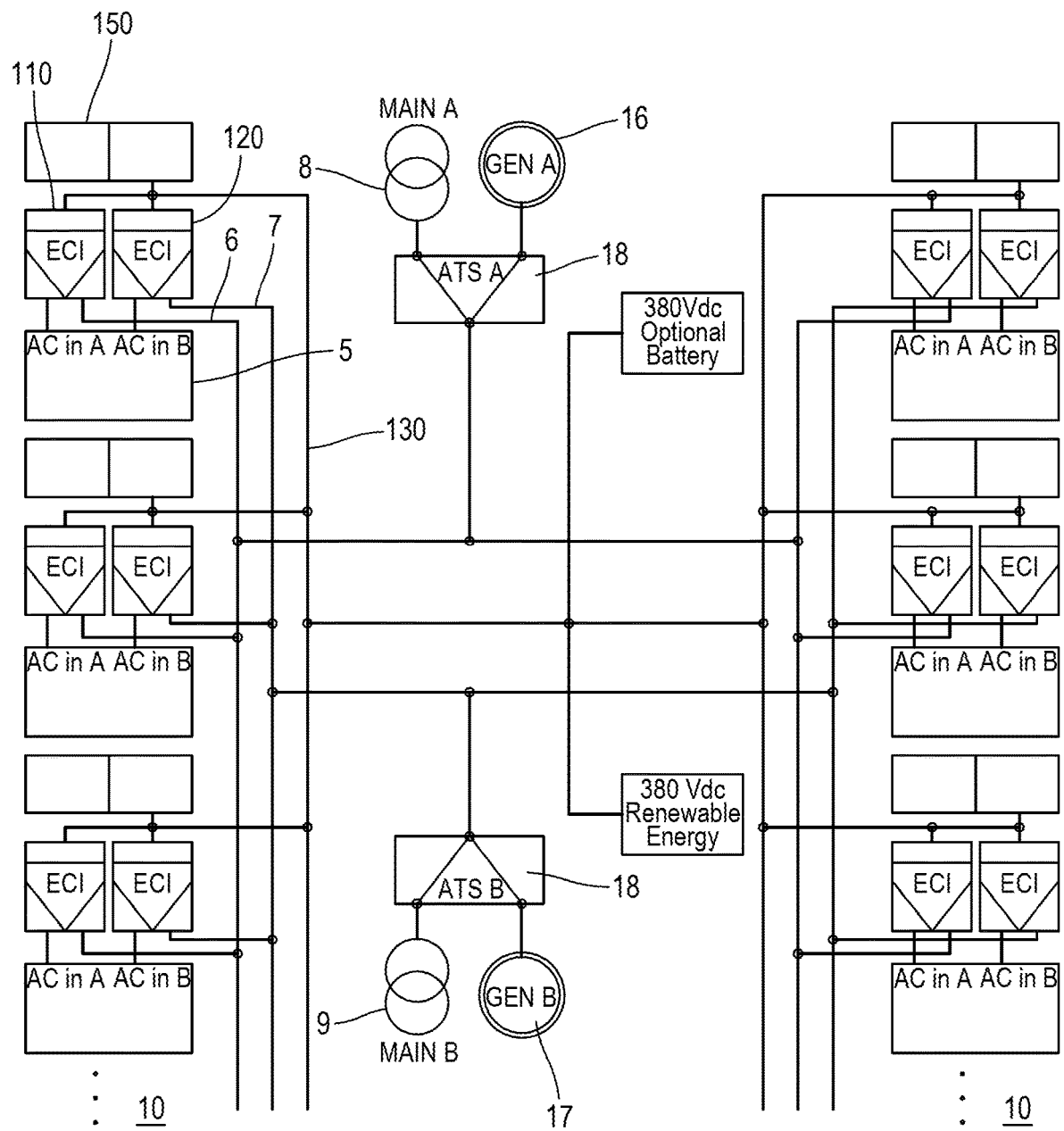
FIG. 9 is schematically representing an embodiment of the present invention corresponding to a decentralized data center (data center "D").

More particularly, as depicted on FIG. 9, each string 10-linked server unit 5 is associated with a first local UPS unit 110 whose AC terminals are connected at the first external AC power bus 6 between the first AC input of said server unit 5 and the first AC grid 8 or the first central auxiliary power unit 16 respectively through first ATS 18, and with a second local UPS unit 120 whose AC terminals are connected at the second external AC power bus 7 between the second AC input of said server unit 5 and the second AC grid 9 or the second auxiliary power unit 17 respectively through second ATS 18, the DC input of the first and the second UPS units 110, 120 being each connected to an inter-satellites DC power bus 130. Additionally, a local bidirectional battery-supplied DC/DC converter module 150 is associated with said string 10-linked server unit 5 via the inter-satellites DC power bus 130, so as to allow local energy storage for power peak shaving.

According to one embodiment, a third architecture is proposed: data center "M" (for "mixed").

Figure 10:
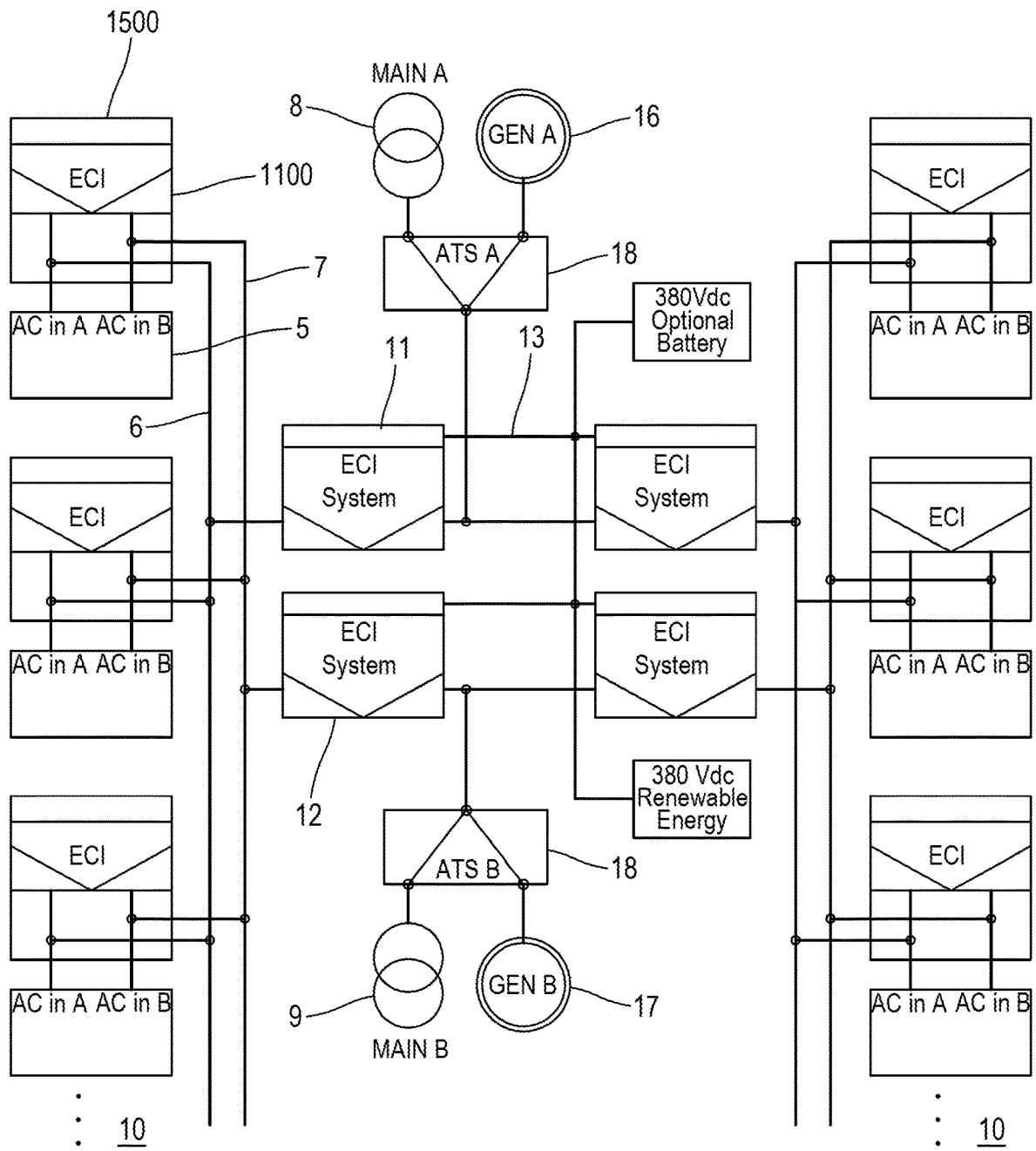
FIG. 10 is schematically representing an embodiment of the present invention corresponding to a mixed data center (data center "M").

Each server string (n server cabinets in a string) has two centralized UPS (A+B AC input/output) of ECI type (modular/redundant) connected to 380V DC grid having centralized 380V DC battery (optional) and renewable 380V DC (see FIG. 10).

Moreover for each server cabinet, a UPS converter of ECI type in connected in parallel to the AC entries of the server cabinet (ACin A and B), the parallel UPS converter of ECI type realizing the "power peak shaving" for each AC entry of the server cabinet. The parallel UPS converter of ECI type can also achieve the balance between the AC lines A and B.

The nominal ECI UPS power is between 4 and 6nP, for 4nP server peak power.

More particularly, as depicted on FIG. 10, the AC output and the AC input of a first centralized UPS unit 11 are connected at the first external AC power bus 6 to each server unit 5 in a string 10 of and to the first AC grid 8 or the first central auxiliary power unit 16 respectively through first ATS 18, the DC input of the first centralized UPS unit 11 being connected to the internal DC power bus 13, wherein the AC output and the AC input of a second centralized UPS unit 12 are connected at the second external AC power bus 7 to each server unit 5 in the string 10 and to the AC second grid 9 or to the second central auxiliary power unit 17 respectively through second ATS 18, the DC input of the second centralized UPS unit 12 being connected to the internal DC power bus 13, and wherein the AC input and the AC output of a local UPS unit 1100 are connected in parallel on the first external AC power bus 6 at the first AC input and on the second external AC power bus 7 at the second AC input of each server unit 5 respectively, the DC input of the local UPS unit 1100 being connected to a DC energy storage unit 1500a such as a L-ion battery, so as to achieve a power peak shaving.

Comparison Between the Three Architectures "C", "D" and "M"

It can be shown that the "M"-solution combines the advantages of centralized solution "C" and decentralized solution "D":

decentralized and centralized nominal UPS power: lower than in "C" or "D";

height occupied by server cabinet of 10 kW peak (2U) in between the one of "C" (0) and the one of "D" (4U);

lower total UPS cost (without storage), even lower than in "C";

main AC input rating (A+B) and GENSET AC input rating (A+B) as in "D", lower than in "C";

AC distribution and cable rating: power peak shaving as in "D";

DC distribution and cable rating: remains at level centralized UPS and renewable power energy as in "C";

Connection to renewable: possible as in "C" and "D";

Local battery Li-ion or centralized 380V DC batteries: available;

Battery solution is open to optimization between centralized storage and decentralized storage; quick cycle and low cycle (as in "D", while "C" is a single solution);

Global electric efficiency: average/high because high power of UPS (as in "C") and effect of "peak shaving" DC/DC converter (as in "D", but in "D" low efficiency due to multiple UPS units).)

In conclusion, the "mixed" solution "M" is advantageous while keeping the advantages of both "worlds", the centralized one and the decentralized one.

All these architectures described here above are novel over prior art.

Document US 2015/061384 A1 discloses the principle of the DC bus powering the power storage units associated to decentralized rack UPS. The notion of sharing energy between resource zones is also disclosed (part of the storage is dedicated, part of it is shared). This is close to architecture "D" but only with one AC power bus. Moreover the DC power bus bar connecting in common the storage elements of the different UPS is operated at a single voltage.

Document US 2008/030078 A discloses a "highly efficient uninterruptible power distribution architecture to support modular processing units". The different data center rack units or modules are powered by an AC power bus. Each module is locally associated with a UPS. There is no common DC bus allowing to share power from a module to another. On FIG. 4 appears the notion of DC bus and centralized UPS powering in DC several racks. But the notion of sharing energy between the racks is not present. The "decentralized' "D" architecture is not disclosed. This architecture would be closer to architecture "C" without redundancy of the AC power bus. Also in architecture "C" the UPS is operating on the AC bus, not at the level of the DC bus.

Document US 2011/018342 A1 discloses a data center having a string of AC powered servers in which a common DC backup power source can share energy with all the servers. The presence of UPS is not mentioned although the possibility of recharging the batteries with the AC power source is mentioned.

LIST OF REFERENCE SYMBOLS

1 UPS (ECI)
2 AC bidirectional input of UPS (ECI)
3 DC bidirectional input of UPS (ECI)
4 AC bidirectional output of UPS (ECI)
5 String-linked server
6 First external AC power bus
7 Second external AC power bus
8 First AC grid
9 Second AC grid
10 String of servers
11 Power Backup Satellite (UPS/ECI)
12 Power Backup Satellite (UPS/ECI)
13 Internal DC power bus
14 Renewable energy source
15 DC energy storage unit
16 First central auxiliary power unit
17 Second central auxiliary power unit
18 Automatic transfer switch (ATS)
110 First decentralized UPS unit
120 Second decentralized UPS unit
130 Internal or inter-satellites DC power bus (D)
150 DC/DC converter module (D)
1100 Local parallel UPS unit (M)
1500 DC storage unit (M)

The invention claimed is:

1. A data center or telecom environment, comprising:
a first external AC power bus (6) powered by a first AC grid (8) and a second external AC power bus (7) powered by a second AC grid (9);
a plurality of string (10)-linked server units (5) providing computing resources, each server unit (5) having a first AC input connection to the first external AC power bus (6) and a second AC input connection to the second external AC power bus (7), said first external AC power bus (6) and said second external AC power bus (7) connecting each in series all the server units (5) linked in the string (10),
at least one uninterruptible power supply unit, in short UPS unit, acting as a power backup satellite (11) connected to the first external AC power bus (6) and at least one UPS unit acting as a power backup satellite (12) connected to the second external AC power bus (7), each of the power backup satellites (11, 12) being capable to provide operating power to the computing resources of each of the server units (5) linked in the string (10),
an internal or inter-satellites power bus (13) not directly powered by the first and second AC grids (8, 9), for powering the said power backup satellites (11, 12), so that the value of power supplied to said power backup satellites (11, 12) can vary from a satellite (11, 12) to another one, and
smart control means,
wherein the smart control means are capable to identify an occurrence of a local power peak demand at a particular server unit (5) and to command at least one power backup satellite (11, 12) having power reserve to share at least part of its power reserve with this local server unit (5) via the internal power bus (13), while keeping a voltage on the internal power bus stable and/or in an acceptable range.

2. The data center of claim 1, wherein the internal power bus (13) is a DC power bus or an AC power bus.

3. The data center of claim 2, wherein the internal DC power bus (13) is connected to one or more renewable energy sources (14) or to a DC energy storage unit (15).

4. The data center of claim 3, wherein the DC energy storage unit (15) comprises one or more batteries.

5. The data center of claim 3, wherein the internal DC power bus (13) is a 380V or a 600V HVDC power bus, and/or the DC power supplied to or stored in the power backup satellite (11, 12) is a 48V DC power, possibly through an intermediate DC/DC converter.

6. The data center of claim 2, wherein the power backup satellite (11, 12) is a bidirectional UPS unit, having an AC input (2), an AC output (4) and a DC input (3), said DC input (3) being connectable to an internal DC power bus (13) or to a DC energy source or storage unit (14, 15) for providing temporary power to the UPS unit.

7. The data center of claim 6, wherein a DC storage unit (15) is provided locally at each satellite (11, 12), with a nominal DC voltage which can be different from one power cell (11, 12) to another one.

8. The data center of claim 2, wherein a first and second central auxiliary power unit (16, 17) are connected to the first external AC power bus (6), to the second external AC power bus (7) respectively, being capable to replace when necessary the first AC grid (8), the second AC grid (9) respectively, thanks to an automatic transfer switch (18).

9. The data center of claim 6, wherein the AC output and the AC input of a first centralized UPS unit (11) are connected at the first external AC power bus (6) to each server unit (5) in a string (10) and to the first AC grid (8) or to a first central auxiliary power unit (16) respectively, the DC input of the first centralized UPS unit (11) being connected to the internal DC power bus (13) and wherein the AC output and the AC input of a second centralized UPS unit (12) are connected at the second external AC power bus (7) to each server unit (5) in the string (10) and to the second AC grid (9) or to a second central auxiliary power unit (17) respectively, the DC input of the second centralized UPS unit (12) being connected to the internal DC power bus (13).

10. The data center of claim 6, wherein each string (10)-linked server unit (5) is associated with a first local UPS unit (110) whose AC terminals are connected at the first external AC power bus (6) between the first AC input of said server unit (5) and the first AC grid (8) or a first central auxiliary power unit (16), and with a second local UPS unit (120) whose AC terminals are connected at the second external AC power bus (7) between the second AC input of said server unit (5) and the second AC grid (9) or a second auxiliary power unit (17), the DC input of the first and the second UPS units (110, 120) being each connected to an inter-satellites DC power bus (130).

11. The data center of claim 10, wherein, additionally, a local bidirectional battery-supplied DC/DC converter module (150) is associated with said string (10)-linked server unit (5) via the inter-satellites DC power bus (130), so as to allow local energy storage for power peak shaving.

12. The data center of claim 6, wherein the AC output and the AC input of a first centralized UPS unit (11) are connected at the first external AC power bus (6) to each server unit (5) in a string (10) and to the first AC grid (8) or to a first central auxiliary power unit (16) respectively, the DC input of the first centralized UPS unit (11) being connected to the internal DC power bus (13), wherein the AC output and the AC input of a second centralized UPS unit (12) are connected at the second external AC power bus (7) to each server unit (5) in the string (10) and to the second AC grid (9) or to a second central auxiliary power unit (17) respectively, the DC input of the second centralized UPS unit (12) being connected to the internal DC power bus (13), and wherein the AC input and the AC output of a local UPS unit (1100) are connected in parallel on the first external AC power bus (6) at the first AC input and on the second external AC power bus (7) at the second AC input of each server unit (5) respectively, the DC input of the local UPS unit (1100) being connected to a DC energy storage unit (1500) such as a L-ion battery, so as to achieve a power peak shaving.

13. The data center of claim 12, wherein the local UPS unit (1100) is commanded by the smart control means so as to achieve power balance between the first external AC power bus (6) and the second external AC power bus (7).

14. The data center of claim 1, wherein the server units (5) are distributed over two strings.

15. The data center of claim 1, wherein the peak power sustained by each server unit (5) is 2 time a nominal power.

16. The data center of claim 1, wherein the first and the second AC grids (8, 9) are n-phase AC sources, with n=1, 2 or 3.

17. The data center of claim 1, wherein the first and the second external AC power buses (6, 7) are n-phase AC power buses, with n=1, 2 or 3.

* * * * *